United States Patent [19]
Wuyts

[11] Patent Number: 6,094,264
[45] Date of Patent: Jul. 25, 2000

[54] METHOD AND APPARATUS FOR MEASURING THE POSITION OF A SERIES OF CONTACT PINS AND FOR POSITIONING SAID SERIES IN A PRINTED CIRCUIT BOARD

[75] Inventor: Robert A. Wuyts, Antwerp, Belgium

[73] Assignee: Framatome Connectors International, Courbevoie, France

[21] Appl. No.: 09/184,912

[22] Filed: Nov. 3, 1998

[30] Foreign Application Priority Data

Nov. 5, 1997 [BE] Belgium .................................. 9700888

[51] Int. Cl.⁷ .................................................. G01N 21/88
[52] U.S. Cl. ........................................ 356/237.1; 356/375
[58] Field of Search .............................. 356/237.1, 375; 29/833, 834

[56] References Cited

U.S. PATENT DOCUMENTS

| | | | |
|---|---|---|---|
| 4,553,843 | 11/1985 | Langley et al. | 356/375 |
| 5,278,634 | 1/1994 | Skunes et al. | 356/400 |
| 5,287,759 | 2/1994 | Kaneda | 356/375 |
| 5,309,223 | 5/1994 | Konicek et al. | 356/375 |
| 5,331,406 | 7/1994 | Fishbaine et al. | 356/375 |
| 5,663,799 | 9/1997 | McAulay et al. | 356/237.5 |

FOREIGN PATENT DOCUMENTS

| | | |
|---|---|---|
| 9500914 | 8/1997 | Belgium . |
| 0 772 381 A1 | 5/1997 | European Pat. Off. . |
| WO 92/14988 | 9/1992 | WIPO . |
| WO 97/30572 | 8/1997 | WIPO . |

*Primary Examiner*—Richard A. Rosenberger
*Attorney, Agent, or Firm*—Perman & Green, LLP

[57] ABSTRACT

The method and apparatus comprise a pick-up and insertion head (1) movable along a predetermined direction (Y-axis) between a pick-up area (3) provided for electronic components bearing an array of contact pins (6) and a printed circuit board (20), whereby during the movement of the pick-up and insertion head (1), having picked up a component provided with contact pins (6) from the pick-up area (3), between the pick-up area (3) and the printed circuit board (20), the position of the contact pins along the Y-axis are detected by means of a first laser beam (7) determining the actual position of each pin along said Y-axis as a first array of data, almost at the same time the position of the contact pins along the X-axis are detected by means of a second laser beam (13) determining the actual position of each pin along the X-axis as a second array of data; by means of said two arrays of data, the mean center position of each pin can subsequently be computed and compared with the normal allowable center position thereof, subsequently, a correction can be applied on the position of the head (1) bearing the component (2) provided with the contact pins (6) before said contact pins (6) are inserted in corresponding holes (5) in the printed circuit board (20).

10 Claims, 2 Drawing Sheets

METHOD AND APPARATUS FOR MEASURING THE POSITION OF A SERIES OF CONTACT PINS AND FOR POSITIONING SAID SERIES IN A PRINTED CIRCUIT BOARD

The present invention relates to a method and apparatus for measuring the position of a series of rows of contact pins which form generally an integrated portion of an electronic part, such as a preassembled connector, and for positioning said series of rows of contact pins of the press-fit type in a board of the PC (printed circuit) type, or printed circuit board.

In the belgian patent BE 9500914 to the applicant is described a method and an apparatus wich uses an asynchronous camera making an image of the series of contact pins on the underside of the connector to be inserted in the PC board. The exact positioning of the central axis of the contact pins is thereafter computed by means of an adapted computer program.

The apparatus is able, based on the obtained values, to guide the exact positions of the connector pins in relation to the printed circuit board before press fitting said connector pins into the board. The apparatus, in case the configuration of the contact pins lies outside the allowed tolerance, expels the rejected connector automatically.

Such method uses a camera and a light source in order to define an image of the underside of the connector. Another camera makes an image of the corresponding holes in the printed board.

The method and apparatus described in this patent function without any problem and effectively under the provision that connectors are used of which the underside of the connector housing is closed.

Considering that other types of connectors have to be processed with such apparatus, problems arose with connectors the housing of which is provided at the bottom thereof with openings other than the openings for the contact pins.

In such cases, the contact members in the connector reflect parasite light, which acts perturbatingly on the precise image building, which results in the computer not being able to determine the exact central axis of the contact pins.

One object of the present invention is to provide a method and an apparatus which make it possible, in such cases, to solve the problem of measuring the correct axis of the positions of the series of rows of contact pins in an simple and adequate manner.

A further objet of the present invention is to provide an apparatus which make it possible to, once the position of the series of rows of contact pins is measured, apply a correction to the position of the connector in relation to the corresponding holes in the PC board.

The method and the apparatus of the present invention are, in order to reach such objects, characterized by steps and means which are further described in the appended claims.

For a better understanding and further details of the invention, reference should be made to the following description of an embodiment and drawings wherein.

Figure 1:
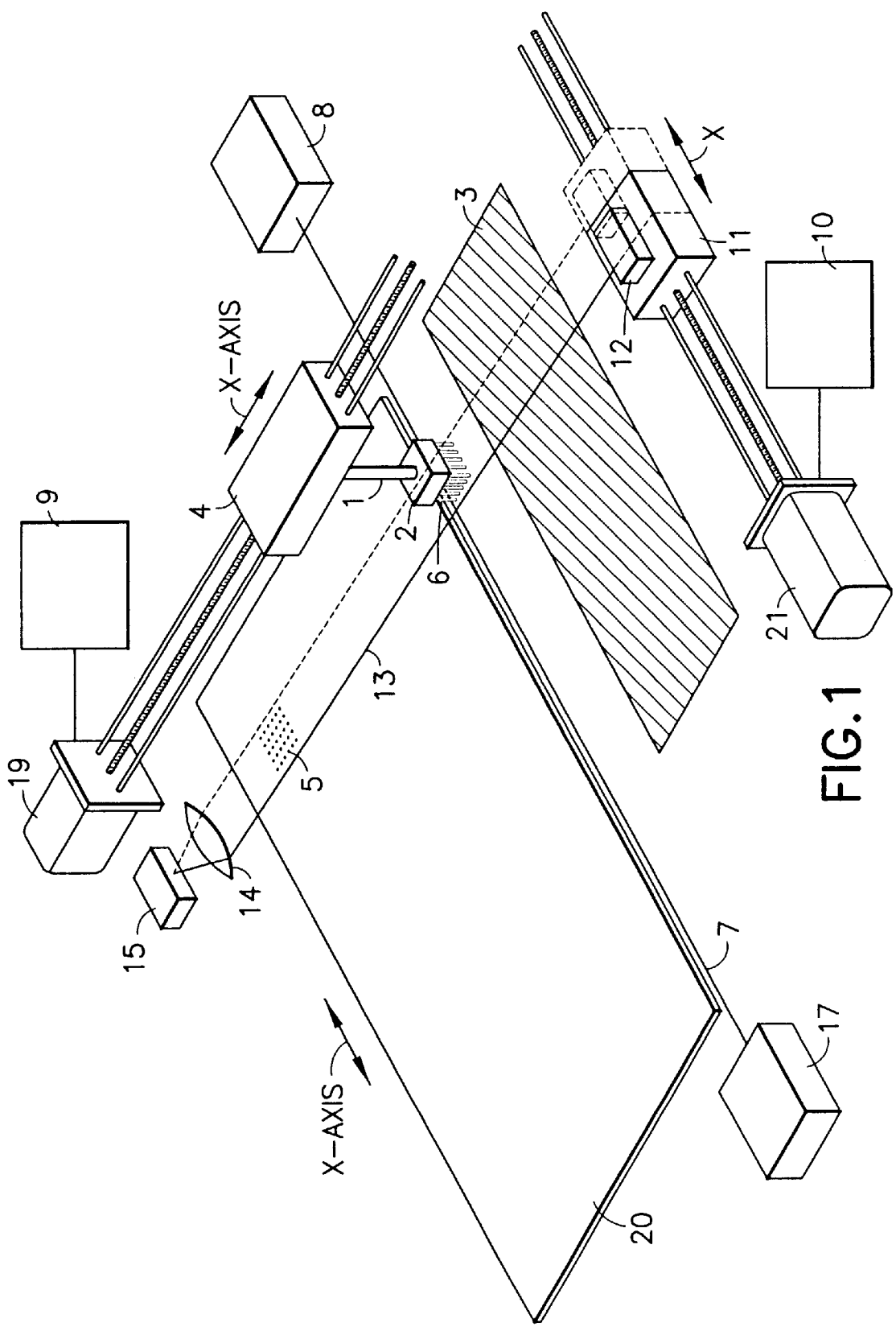
FIG. 1 is a schematic representation of the configuration and the movements of the essential parts of the apparatus.

FIG. 1 shows a pick-up and inserting head (or pick-up and insertion tool) 1 as described in further detail in belgian patent BE 9500914, which picks up an electronic part such as a connector 2 provided with contact pins 6 from a feeding and pick-up area 3 (connector pick-up area).

The connector is moved from the pick-up area 3 to the insertion position 5 thereof in the printed board 20 by means of a carriage 4 which moves along the Y-axis.

According to the invention, the apparatus is provided with a fixed laser emitter 17 outputting a laser beam 7 directed to an opposed laser receiver 8. Such laser emitter 17 and laser receiver 8 are positioned in such a manner that the laser beam 7 is able to detect the contact pins 6 of the connector 2 while said pins are moving between the pick-up area 3 and the position of the printed circuit board 20.

During such movement, each individual pin of the row of pins 6 of a connector 2 crosses successively the laser beam 7 along the Y-axis.

The laser receiver 8 will thus effect a change in its output signal each time the laser beam 7 will cross the leading edge (LE) and the trailing edge (TE) of each pin 6.

The electric signals received from the outlet of the laser receiver 8 can be used for the determination of the instant position of the carriage 4 along the Y-axis.

Such instant position of carriage 4 can be received at any moment from the register of the servo-control device 9 of the motor 19 driving the carriage 4 along the Y-axis.

A first series of position values for each pin or row of pins along the Y-axis can thus be determined by means of these steps.

Connectors show in general also a possible deviation of the position of pins 6 along the direction of the X-axis, which results in the necessary determination of the position of the pins along the X-axis.

For the determination of the positions of the pins along the X-axis, use is also made according to the invention of a laser beam.

As the connector 2 is not moved along the X-axis during the transport thereof from the pick-up area 3 to the board 20 and in order to avoid any time-consuming and uneffective handling of the connector, the laser emitter 12 is fixed on a carriage 11 able to be moved along the X-axis and driven by a motor 21 with associated servo-control device 10.

The laser beam 13 emitted from the emitter 12 is received in a receiver 15. As the laser beam 13 is moved between an initial and a final position on the X-axis, the laser receiver 15 is provided with a converging lens 14 which focusses the moving laser beam always on the same point on the receiver.

The emitter 12 and the receiver 15 with lens 14 are arranged in such a manner that the laser beam 13 is able to detect the contact pins 6 of the connector 2 along the X-axis.

The laser beam 13 will thus also be able to detect the leading and trailing edges of the contact pins and convert such in respective signals in the receiver 15.

The instant position values of the edges of the pins will be made available in the register of the servo-control device 10 of the motor 21 through the determination of the position of the carriage 11.

A second series of position values will consequently be determined for each row of contact pins along the X-axis.

The servo-control device 10 will preferably start the movement of the laser emitter 12 along the X-axis with the carriage 11 at the time when the first contact pins 6 of the connector 2 crosses the laser beam 7 directed along the Y-axis.

It is evident that, according to this embodiment of the invention, the laser beams 7 and 13 are directed at right angle in relation to each other.

The measurements and the determination of the mutual positions of the contact pins both along the X-axis and the Y-axis are thus carried out while the connector 2 is moved from the pick-up area 3 into the location 5 where the connector has to be inserted by press-fitting in the PC board 20.

By means of the near-simultaneaous determination of the mutual positions of the contact pins along the X-axis and the Y-axis, two series of values are obtained, from which the respective mean central points or axis of each pin or row of pins can be computed.

Considering that the data of the normal positions of the central points of the pins of a definite connector are made available to the apparatus, and more specifically the computer unit of such apparatus, a mean correction can as a consequence be defined and applied on the vertical axis of the insertion head 1 and of connector 2, in order to push then the contact pins 6 into the corresponding holes 5 in the PC board 20 without problem.

Should the correction to be applied extend beyond the allowed values or tolerances, the connector is removed automatically in order to avoid any damage to the PC board.

For the comprehensiveness of the description, mention should also be made that the position of the holes 5 in the PC board 20 are detected and determined as already described in the belgian patent BE 9500914, i.e. by means of a camera of the "CCD" type (Charged Coupled Device), which determines the positions of the corresponding holes 5 by means of building an image thereof.

Figure 2:
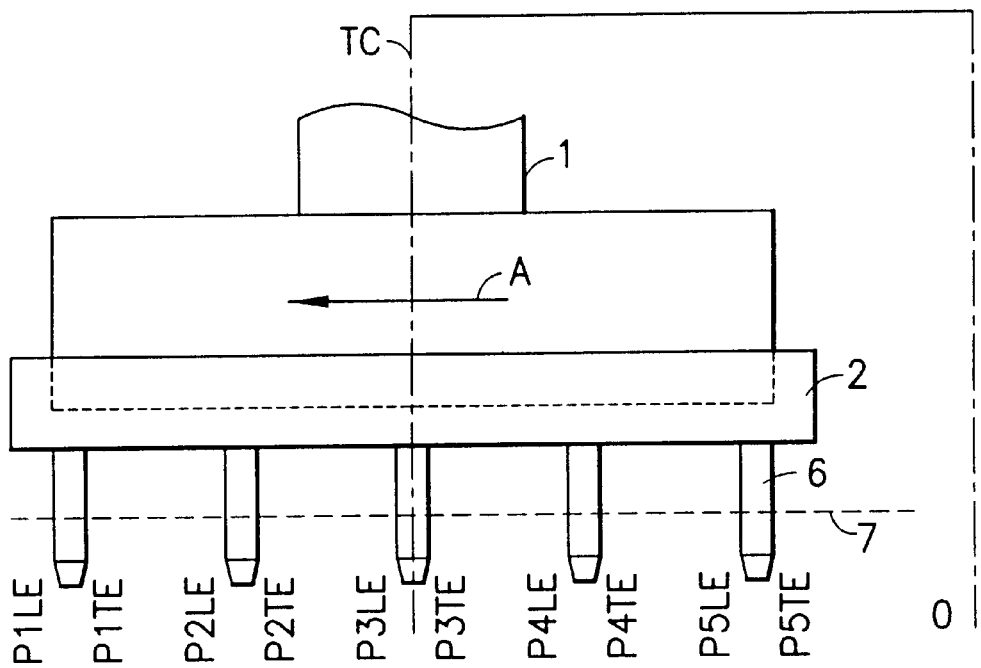
FIG. 2 is a front view of a connector with a series of rows of pins along the Y-axis.
Figure 3:
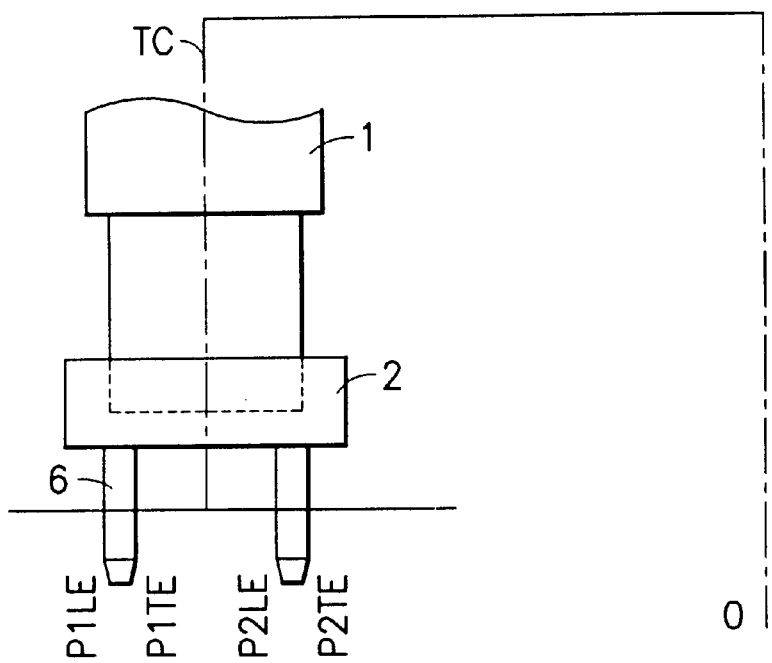
FIG. 3 is a side view of the connector of FIG. 2, with a series of rows of pins along the X-axis.

FIGS. 2 and 3 show how the measurements are carried out by means of the respective laser beams 7 and 13.

The connector 2 with contact pins 6 positioned along the X-axis and the Y-axis is picked-up by the tool or pick-up and insertion head 1.

During the transport of the connector 2 in the direction of arrow A, the laser beam 7 will successively detect the positions of the leading edge of the first pin or row of pins (P1LE), the trailing edge of the first pin or row of pins (P1TE), the leading edge of the second pin or row of pins (P2LE), the trailing edge of the second pin or row of pins (P2TE), etc., whereby corresponding signal are determined in the receiver and converted in instant positions which are received by means of the register of the servo-control device 9 of the motor 19.

All the positions are measured in relation to a "0" position, whereas the distance of the center of the head 1 or tool (TC) is determined in relation to this "0" position.

The mean value of the measured positions of the center of each pin (or row of pins) is then computed in relation to the axis or centerline (TC) of head 1, according to the following formula:

P1g=(P1LE+P1TE)/2−TC ...

Png=(PnLE+PnTE)/2−TC

If P1SP, P2SP, . . . , PnSP are the normal or desired positions of pins P1, P2, . . . , Pn as measured in relation to the center of the head 1 or tool (TC), the mean correction to be applied on the collection of pins or the connector is:

[(P1g−P1SP)+(P2g−P2SP)+ . . . +(Png−PnSP)]/n

The sign of the result of such correction is dependant of the pins being ahead or behind the normal or desired positions.

In case the correction is greater than a preset maximum value, the apparatus will either stop, with the display of an error message, or will reject the connector concerned.

The outputs of the laser receivers 8 and 15 are connected to the respective servo-control devices 9 and 10, for the determination of the instant positions of the contact pins 6.

An "instant position register" is thereby determined during the detection of a leading or trailing edge of a pin or row of pins. The register contains successive PLE and PTE values.

One of the important advantages that can be obtained with the invention is that a very important shortening of measurement time is achieved by means of the application of a fixed laser beam 7 in the direction along which the row of contact pins are moved and of a moving laser beam 13 in the direction along which the row of contact pins remains motionless, since the measurement is carried out during the normal period of time elapsing between the pick-up of the connector and the insertion thereof in the PC board.

Meanwhile, no additional handling needs to be carried out, such as the pivoting of the connector about 90° in order to be able to carry out the measurement along the other direction.

What is claimed is:

1. Method for measuring the position of an array of contact pins (terminals) (6) and for installing said array on a printed circuit board, wherein a pick-up and inserting head (1) is moveable along a predetermined direction (Y-axis) between a pick-up area (3) provided for electronic components bearing the array of contact pins (6) and the printed circuit board (20), characterized in that after the pick-up and inserting head (I) has taken a component provided with contact pins (6) from the pick-up area (3), the positions of the contact pins along the Y-axis are detected in the course of the movement of said head between the pick-up area (3) and the printed circuit board (20), in order to determine the actual position of each pin along said Y-axis, as a first array of data, the positions of the contact pins along the X-axis are detected sensibly at the same time in order to determine the actual position of each pin along the X-axis, as a second array of data, the mean centre position of each pin can subsequently be computed and compared with the normal allowable centre position thereof by means of said two arrays of data, the step of detecting the position of the contact pins in the Y-axis direction and the X-axis direction further including providing a detection means for effecting detection of said position of said pins in said respective X- and Y- axis directions and moving one of said detection means corresponding to said one of said X- and Y- axis directions relative to said contact pins to effect detection of said pins in said one of said X- and Y- axis directions while maintaining the other of said detection means stationary to effect detection of said pins in said other of said X- and Y- axis directions, a correction can be subsequently applied on the position of the head (1) bearing the component (2) provided with the contact pins (6) before said contact pins (6) are inserted in corresponding holes (5) in the board (20).

2. Method according to claim 1, characterized in that the positions of the contact pins (6) both along the X-axis and the Y-axis are determined by means of successively measuring the front edge and the rear edge of each respective successive pin (6) or pin row.

3. Method according to claim 1, characterized in that the mean centre position of each pin in relation to the centre of the pick-up and inserting head (1), both along the X-axis and the Y-axis, is computed after the positions of the respective front and rear edge of each pin (6) or pin row are determined.

4. Method according to claim 1, characterized in that the so determined mean centre position of each pin (6) is compared with the normal desirable mean center position, whereby the correction to be applied on the position of head (1) bearing the component (2) can be computed before the contact pins (6) are pressed into the corresponding holes (5) in the board (20).

5. Method according to claim 4, characterized in that an error message will be provided if the correction to be applied is greater than a preset maximum value, whereby the component (2) may be discarded.

6. Apparatus for measuring the positions of an array of contact pins (6) and for installing said array on a printed circuit board (20), wherein the apparatus is provided with a pick-up and inserting head (1) moveable along a predetermined direction (Y-axis) by means of a carriage (4) driven by a motor (19) with servocontrol (9), between a pick-up area (3) provided for the electronic components bearing the array of contact pins (6) and the printed circuit board (20), characterized in that the actual position of the array of contact pins (6) is determined by means of laser beams (7, 13) determining both the positions along the Y-axis and the X-axis said laser beams determining said position of said pins in said respective X- and Y- axis directions by moving one of said laser beams corresponding to said one of said X- and Y- axis directions relative to said contact pins to effect detection of said pins in said one of said X- and Y- axis directions while maintaining the other of said laser beams stationary relative to said pins to effect detection of said pins in said other of said X- and Y-axis directions.

7. Apparatus according to claim 6, characterized in that a first laser beam (7) is generated by a fixed laser emitter (17) and received by a receiver (8), said emitter and receiver being so positioned that the laser beam (7) is able to detect the contact pins (6) in the course of the passing-through of said pins between the pick-up area (3) and the printed circuit board (20).

8. Apparatus according to claim 6, characterized in that the second laser beam (13) is generated by a laser emitter (12) which is fixed on a carriage (11) moveable along the X-axis and driven by a motor (21) provided with a servocontrol (10), wherein the laser beam is received by a receiver (15) provided with a converging lens (14), and wherein said emitter (12) and receiver (15) are so positioned that the beam (13), in the course of the movement thereof along the X-axis, is able to detect the array of contact pins (6).

9. Apparatus according to claim 6, characterized in that the output signals of the laser receivers (8, 15) are respectively connected with servocontrols (9, 10) for determining the actual positions of the contact pins (6).

10. Apparatus according to claim 9, characterized in that the servocontrol (10) initiates the movement of the laser emitter (12) along the X-axis at the moment when the first contact pins (6) of component (2) crosses the laser beam (7) along the Y-axis.

* * * * *